United States Patent [19]

Kessler

[11] Patent Number: 5,684,293
[45] Date of Patent: Nov. 4, 1997

[54] ANTI-ALIASING LOW-PASS BLUR FILTER FOR REDUCING ARTIFACTS IN IMAGING APPARATUS

[75] Inventor: David Kessler, Rochester, N.Y.

[73] Assignee: Eastman Kodak Company, Rochester, N.Y.

[21] Appl. No.: 564,612

[22] Filed: Nov. 29, 1995

[51] Int. Cl.$^6$ ............................................. H01L 27/00
[52] U.S. Cl. .............................. 250/208.1; 348/342
[58] Field of Search ..................... 250/208.1; 348/340, 348/342

[56] References Cited

U.S. PATENT DOCUMENTS

| | | | |
|---|---|---|---|
| 3,838,906 | 10/1974 | Kumada | 350/150 |
| 3,923,379 | 12/1975 | Kumada | 350/150 |
| 4,101,929 | 7/1978 | Ohneda et al. | 358/44 |
| 4,896,217 | 1/1990 | Miyazawa et al. | 358/213.11 |
| 4,989,959 | 2/1991 | Plummer | 350/447 |
| 4,998,800 | 3/1991 | Nishida et al. | 350/162.2 |
| 5,043,803 | 8/1991 | Asaida | 358/41 |
| 5,321,251 | 6/1994 | Jackson et al. | 250/208.1 |
| 5,322,998 | 6/1994 | Jackson | 250/216 |
| 5,438,366 | 8/1995 | Jackson et al. | 348/342 |
| 5,471,343 | 11/1995 | Takasugi | 348/342 |
| 5,477,381 | 12/1995 | Sasaki et al. | 348/342 |

Primary Examiner—Edward P. Westin
Assistant Examiner—Kevin Pyo
Attorney, Agent, or Firm—Nelson A. Blish

[57] ABSTRACT

An imaging apparatus for generating an image signal from incident image light having its higher spatial frequencies limited to reduce undersampling artifacts includes an image sensor for generating the image signal from an array of photosites, and an optical section having a biaxial crystal optical filter interposed in the path of the incident image light so as to output a blurred image upon said photosites. The optical filter has two optical axes along which light can propagate and experience the same index of refraction for any polarization. The optical filter has parallel input and output surfaces; and one of the two optical axes is perpendicular to the input and output surfaces. The optical filter has "X", "Y", and "Z" axes; and the "Z" axis bisects the two optical axes. Preferably, the "Z" axis and the optical axes define the angle $\Theta$ such that:

$$\tan\Theta = (N_z/N_x)SQRT[(N_y^2-N_x^2)/(N_z^2-N_y^2)].$$

The optical filter has three indices of refraction, $N_x$, $N_y$, and $N_z$. As an example, $N_x=1.779$, $N_y=1.789$, and $N_z=1.887$ for an optical wavelength of 532 nm.

7 Claims, 2 Drawing Sheets

ANTI-ALIASING LOW-PASS BLUR FILTER FOR REDUCING ARTIFACTS IN IMAGING APPARATUS

BACKGROUND OF THE INVENTION

1. Technical Field

The present invention pertains to an optical low-pass filter used in the optical path of an electronic imaging system to reduce aliasing, or undersampling, effects.

2. Background Art

An electronic imaging system typically produces a signal output corresponding to a viewed object by spatially sampling an image of the object in a regular pattern with an array of photosensitive elements, such as, for example, with a charge-coupled device (CCD) solid-state image sensor. In such an imaging system, it is well-known that detail components in the object which contain frequencies too high to be analyzed within the sampling interval of the sensor contribute to the amplitudes of lower frequency components, and thereby produce imaging errors commonly referred to as aliasing or undersampling artifacts. In particular, if spatial detail being imaged contains a high frequency component of a periodicity smaller than the pitch (periodicity) of each neighboring photosensitive picture element of the solid state image sensor, the subsequent detection of this high frequency component tends to result in a spurious signal due to aliasing.

In general, the electronic imaging system can minimize aliasing if its optical section has a frequency response that cuts off, or filters out, the higher frequency content of the object. As a result, the optical section generally employs an optical low pass filter to substantially reduce the high frequency component contained in the spatial detail of the image received by the image sensor. It is thus well-known in the prior art that the design of electronic imaging systems involves a trade-off between image sharpness and the susceptibility of the imaging system to aliasing distortions or undersampling artifacts.

To limit these artifacts, an optical filter such as, for example, a birefringent blur filter has become a common component in consumer color video cameras. U.S. Pat. Nos. 4,101,929 and 4,896,217 show typical examples of such filters. Such a filter is typically placed between a lens and the image sensor to provide a low-pass filter function which reduces the spatial frequency content of the object at frequencies above the Nyquist frequency of the photosensitive elements. This makes the imaging system less susceptible to aliasing distortion. For example, for many available sensors wherein equal pixel densities in each of the sensed colors provide that each of the sensed colors have the same Nyquist frequency, an achromatic low-pass, or "blur", function is effective in minimizing aliasing distortion. Such a function can readily be provided by a birefringent filter.

The birefringent blur filter is typically composed of filter plates manufactured from a crystalline material like quartz that exhibits a dual refraction effect when the crystal axes of the filter plates are oriented at an angle with respect to the plate surface. In this orientation, a randomly polarized ray of light passing through such a filter plate emerges as two separated polarized rays. The combination of several of such plates produces a multiple spot pattern from each incident point in the image. If this spot pattern distributes light energy over multiple photosensitive elements, then the effect of a blur is obtained. This will limit the optical transfer function of the system at spatial frequencies above the Nyquist frequency of the photosensitive elements. However, this type of filter suffers from the drawback that it is costly and complicated to manufacture. In addition, a practical birefringent filter tends to be rather large and thick. Indeed, the thickness required to achieve the desired blur requires a lens with a long back focal length in order to make room for the blur filter in the optical path. Space limitations often do not allow such an optical structure, and lens design becomes unduly complicated.

It is also well known in the art to use a phase diffraction grating as a frequency selective filter to produce an image blur. For example, as shown in U.S. Pat. No. 4,998,800, the periodicity of an image of a diffraction grating projected onto a solid state image sensor is selected to be a multiple of the periodicity of the photosensitive picture elements, and a blurred image is obtained. This type of filter, however, suffers from the drawback that, instead of producing a tightly controlled pattern over a few photosensitive elements, it spreads light over many interference fringes (orders) theoretically out to infinity. In addition, it is difficult to control the energy distribution in the fringes in order to obtain an acceptable blur function covering a designated number of pixels. Moreover, the energy distribution is dependent upon wavelength.

As can be appreciated from the foregoing remarks, there is a need in the art for a physically small blur filter that is inexpensive and relatively simple to manufacture, yet which produces a tightly controlled blur pattern that is not dependent upon polarization techniques. As an alternative to the birefringent blur filter and the phase diffraction grating, U.S. Pat. No. 4,989,959 discloses a pyramidal structure comprised of four wedges which divide incident light into four quadrants so that light from the same image point impinges, on the average, on several photosensitive elements in the image sensing device. To produce four abutting facets at identical angles on a single piece of material, one facet would ordinarily be machined or ground into a single piece of material, the piece would then be cut into sections, and the sections glued together to form a piece shaped like a pyramid. This is a difficult manufacturing process to execute with the needed precision. While there are optical benefits in using a pyramidal blur filter as compared to other blur filters known in the prior art, the manufacture thereof remains a complicated and costly process. Further, this anti-aliasing filter is positioned at the lens pupil (or at the exit or entrance pupil); not in proximity to the imager. By placing the filter at the pupil, any auto focusing system present may be confused. Also, the lens has to be designed to accommodate such placement of the filter. Since the filter is focal length dependent, it will not work with a zoom lens.

Commonly assigned U.S. Pat. No. 5,322,998 and No. 5,438,366 disclose a conical blur filter that reduces undersampling artifacts by outputting a blurred image produced by limiting higher spatial frequencies of incident image light. The blurred image takes the form of a circular blur pattern, for each input point source. Depending upon the shape of the filter, the circular blur pattern may be an annular blur pattern covering a two-dimensional array of photosites, or the central part of the pattern may be filled in with blurred light. Although this is a very good filter if there is ready access to the pupil, it too is located at the aperture, may confuse an auto focus system if there is one, and will not work with a zoom system.

DISCLOSURE OF THE INVENTION

The aforementioned problems are solved according to a feature of the present invention by the use of an imaging apparatus for generating an image signal from incident image light having its higher spatial frequencies limited to reduce undersampling artifacts. The apparatus includes an image sensor for generating the image signal from an array of photosites, and an optical section having a biaxial crystal optical filter interposed in the path of the incident image light so as to output a blurred image upon said photosites.

According to another feature of the present invention, the biaxial crystal optical filter has two optical axes along which light can propagate and experience the same index of refraction for any polarization. The biaxial crystal optical filter has parallel input and output surfaces; and one of the two optical axes is perpendicular to the input and output surfaces.

According to another feature of the present invention, the biaxial crystal optical filter has "X", "Y", and "Z" axes; and the "Z" axis bisects the two optical axes. Preferably, the "Z" axis and the optical axes define the angle $\Theta$ such that:

$$\tan \Theta = (N_z/N_x) SQRT[(N_y^2 - N_x^2)/(N_z^2 - N_y^2)].$$

According to another feature of the present invention, the biaxial crystal optical filter has three indices of refraction, $N_x$, $N_y$, and $N_z$. As an example, $N_x = 1.779$, $N_y = 1.789$, and $N_z = 1.887$ for an optical wavelength of 532 nm.

The invention, and its objects and advantages, will become more apparent in the detailed description of the preferred embodiments presented below.

BRIEF DESCRIPTION OF THE DRAWINGS

In the detailed description of the preferred embodiments of the invention presented below, reference is made to the accompanying drawings, in which.

BEST MODE FOR CARRYING OUT THE INVENTION

The present description will be directed in particular to elements forming part of, or cooperating more directly with, apparatus in accordance with the present invention. It is to be understood that elements not specifically shown or described may take various forms well known to those skilled in the art. For instance, geometrical relationships of the optical components are not shown or described in detail, except where necessary to describe the invention. Moreover, relative sizings of components shown in the figures are not meant to be taken to scale, since the necessary geometrical relationships and sizings can be readily discerned by one of ordinary skill in this art.

Figure 1:
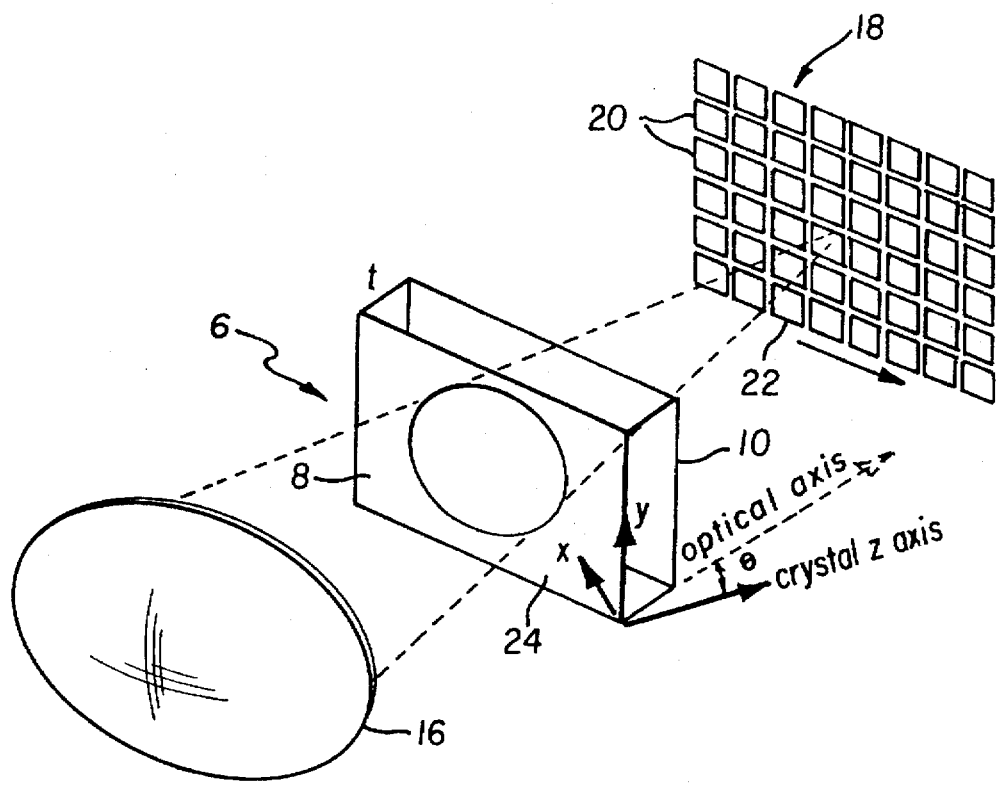
FIG. 1 is a perspective view of a biaxial crystal cut for conic refraction.
Figure 2:
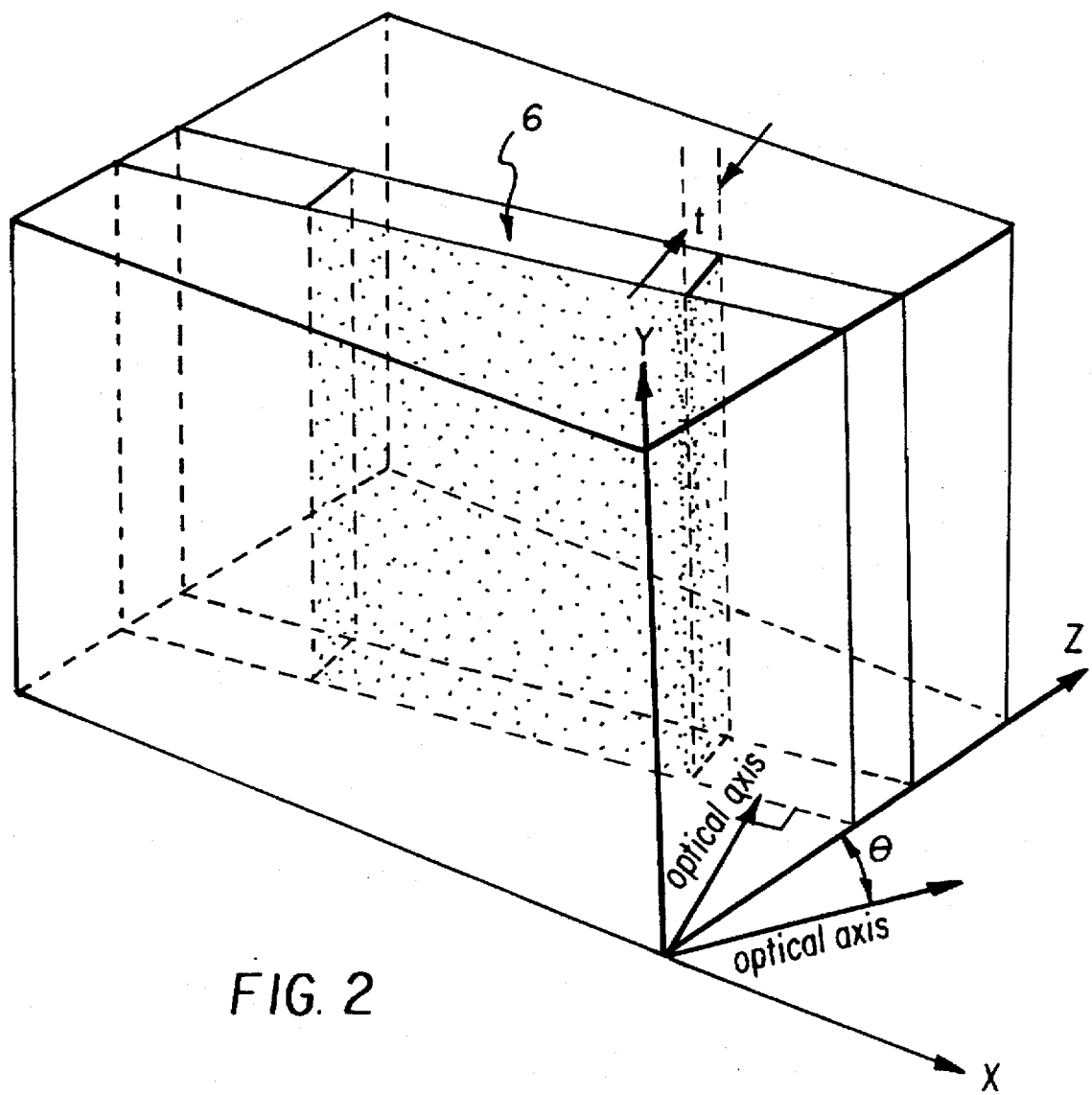
FIG. 2 is an illustration of an imaging system according to the present invention.

Referring to FIGS. 1 and 2, a biaxial crystal 6 has two optical axes along which light can propagate and experience the same index of refraction for any polarization. Biaxial crystals are characterized by three indices of refraction, $N_x$, $N_y$, and $N_z$. In contrast, uniaxial crystals have only two indices of refraction.

For example, potassium titanyl phosphate (KTP), such as made and sold by Litton Airtron of Charlotte, N.C., is a biaxial crystal having indices of refraction $N_x = 1.779$, $N_y = 1.789$, and $N_z = 1.887$ for an optical wavelength of 532 nm. If such a crystal is cut as shown in FIG. 2 so that one of the two optical axes of the crystal is perpendicular to the input and output surfaces 8 and 10, respectively, then a collimated light beam will be transformed into a cone of light within the crystal. Upon departure from output surface 10, the light propagates as a cylinder of light. Commonly, the "Z" axis of the biaxial crystal is chosen to be the bisector of the two optical axes.

Still referring to FIGS. 1, and 2 angle $\Theta$ between the crystal's optical axes and the "Z" axis of the crystal is given by the equality:

$$\tan \Theta = (N_z/N_x) SQRT[(N_y^2 - N_x^2)/(N_z^2 - N_y^2)].$$

The total angle "$2\gamma$" of the cone of light inside of the crystal can be determined by the equality:

$$\tan^2 2\gamma = (N_z^2 - N_y^2)(N_y^2 - N_x^2)/(N_x^2/N_z^2).$$

The diameter "D" of the circle can be determined by the following equality, where is in radians and "t" is the plate thickness:

$$D = 2\gamma t$$

Thus, when an essentially collimated narrow light beam is incident on the crystal, it is converted to a ring-shaped beam of diameter "D". As an example, to obtain a thirteen micron circle diameter with green light, a 0.37 mm thick plate of KTP is required.

Referring to FIG. 1, an image of an object (not shown) is produced by lens 16 onto an image sensor 18 comprised of a two-dimensional array of photosites 20 and an output register 22 for outputting the image signal. A substantially transparent biaxial crystal blur filter 24 is placed between lens 16 and detector 18, wherein the x, y, and z coordinates are the crystal coordinates for the biaxial crystal, z being the bisector of the angle between the two crystal optical axes. The crystal facets are perpendicular to one of the two crystal optical axes, and define input and output surfaces 8 and 10, respectively, so that a collimated light beam from lens 16 will be transformed into a cone of light within the crystal. Upon departure from output surface 10, the light propagates as a cylinder of light toward imaging sensor 18 so as to output a blurred image of the object upon photosites 20. Filter 24 maps each point object into a circular pattern at the focal plane of lens 16, thereby effecting a low pass blur function.

When converging light is passed through the filter, the inclined rays do not exactly follow the conic refraction requirement for near collimation. However, the collection of inclined angles still produces the ring-shaped point spread function (PSF) with essentially the same diameter as the one produced by a collimated light beam.

The modulation transfer function (MTF) of the imaging system can be determined. The Fourier transform of a ring-shaped spot is a Bessel function of the zero order. Thus, the biaxial function is to multiply the MTF of the camera system MTF by this Bessel function.

Figure 3:
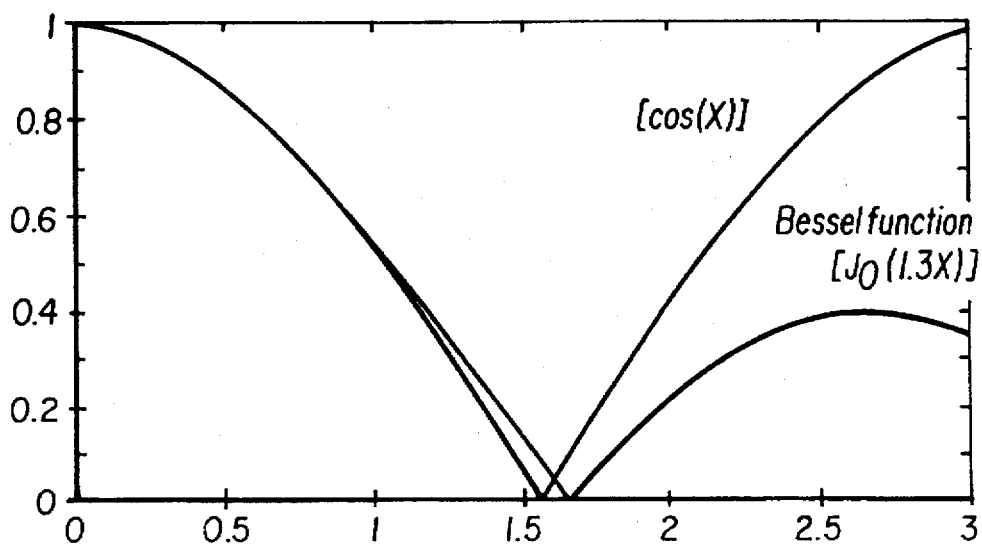
FIG. 3 shows a comparison of the modulation transfer functions of the blur filter according to the present invention and the blur filter of the prior art.

FIG. 3 shows that a Bessel function can approximate a cosine over most of the first half cycle. The MTF of a ring-shaped PSF with diameter of thirteen microns is a very good match to a cosine function for a nine micron, four-spot filter. When the MTF of the detector pixel is also included, the overall MTF performance of the biaxial filter is superior to that of a four spot filter because, as seen in FIG. 3, the attenuation of the frequencies at about x=2 by the Bessel function is stronger than that of the cosine function.

The invention has been described in detail with particular reference to preferred embodiments thereof, but it will be understood that variations and modifications can be effected within the spirit and scope of the invention.

What is claimed is:

1. An imaging apparatus for generating an image signal from incident image light having its higher spatial frequencies limited to reduce undersampling artifacts, said apparatus comprising:

an image sensor for generating the image signal from an array of photosites; and an optical section having a biaxial crystal optical filter interposed in the path of the incident image light so as to output a blurred image upon said photosites.

2. An imaging apparatus as set forth in claim 1 wherein said biaxial crystal optical filter has:

parallel input and output surfaces; and two optical axes along which light can propagate and experience the same index of refraction for any polarization, one of the two optical axes is perpendicular to the input and output surfaces.

3. An imaging apparatus as set forth in claim 1 wherein said biaxial crystal optical filter has:

two optical axes along which light can propagate and experience the same index of refraction for any polarization; and "X", "Y", and "Z" axes, the "Z" axis bisecting the two optical axes.

4. An imaging apparatus as set forth in claim 3 wherein the "Z" axis and the optical axes define the angle $\Theta$ such that:

$$\tan \Theta = (N_z/N_x) SQRT[(N_y^2 - N_x^2)/(N_z^2 - N_y^2)].$$

5. An imaging apparatus as set forth in claim 1 wherein said biaxial crystal optical filter has three indices of refraction, $N_x$, $N_y$, and $N_z$.

6. An imaging apparatus as set forth in claim 5 wherein the three indices of refraction, $N_x$, $N_y$, and $N_z$ are $N_x=1.779$, $N_y=1.789$, and $N_z=1.887$ for an optical wavelength of 532 nm.

7. An imaging apparatus as claimed in claim 1 wherein said optical section includes a lens, and said biaxial crystal optical filter is positioned between said lens and said photosites for blurring the image upon said photosites.

* * * * *